(12) United States Patent
Hume, Jr. et al.

(10) Patent No.: US 8,428,204 B2
(45) Date of Patent: Apr. 23, 2013

(54) RECOVERING DISTORTED DIGITAL DATA

(75) Inventors: George M. Hume, Jr., Portsmouth, RI (US); Robert C. Earl, Tiverton, RI (US)

(73) Assignee: Raytheon Company, Waltham, MA (US)

( * ) Notice: Subject to any disclaimer, the term of this patent is extended or adjusted under 35 U.S.C. 154(b) by 337 days.

(21) Appl. No.: 12/859,910

(22) Filed: Aug. 20, 2010

(65) Prior Publication Data

US 2012/0045026 A1 Feb. 23, 2012

(51) Int. Cl.
*H04L 27/2647* (2006.01)

(52) U.S. Cl.
USPC .......................................... 375/346; 375/316

(58) Field of Classification Search .................. 375/246
See application file for complete search history.

(56) References Cited

U.S. PATENT DOCUMENTS

| | | | | |
|---|---|---|---|---|
| 5,014,270 | A * | 5/1991 | Sillere | 375/293 |
| 5,808,509 | A * | 9/1998 | Baltus et al. | 329/300 |
| RE35,987 | E * | 12/1998 | Harris et al. | 607/63 |
| 7,580,290 | B2 * | 8/2009 | Fong et al. | 365/185.19 |
| 2003/0081149 | A1 * | 5/2003 | Coste | 348/540 |
| 2003/0184393 | A1 * | 10/2003 | Haroun et al. | 331/100 |
| 2004/0125901 | A1 * | 7/2004 | Nakahara et al. | 375/368 |
| 2004/0233973 | A1 * | 11/2004 | Fullerton et al. | 375/130 |
| 2005/0070237 | A1 * | 3/2005 | Moriai et al. | 455/151.1 |
| 2005/0111536 | A1 * | 5/2005 | Cranford et al. | 375/226 |
| 2006/0262843 | A1 * | 11/2006 | Kim et al. | 375/238 |
| 2008/0008253 | A1 | 1/2008 | Sugiura | |
| 2008/0143404 | A1 * | 6/2008 | Shim | 327/158 |
| 2008/0226505 | A1 * | 9/2008 | Willettt et al. | 422/98 |
| 2008/0316832 | A1 * | 12/2008 | Fong et al. | 365/185.19 |
| 2009/0135659 | A1 * | 5/2009 | Jones et al. | 365/185.29 |
| 2010/0158157 | A1 * | 6/2010 | Iwata et al. | 375/320 |
| 2010/0246724 | A1 * | 9/2010 | Park | 375/340 |
| 2011/0248750 | A1 * | 10/2011 | Seo et al. | 327/109 |
| 2011/0286542 | A1 * | 11/2011 | Shelburne | 375/272 |

FOREIGN PATENT DOCUMENTS

| | | |
|---|---|---|
| DE | 19722302 | 12/1998 |
| EP | 0453063 | 10/1991 |
| WO | WO 0145259 | 6/2001 |

OTHER PUBLICATIONS

Notification of Transmittal of the International Search Report and the Written Opinion of the International Searching Authority, or the Declaration, PCT/US2011/039356, date of mailing Nov. 4, 2011, 5 pages.

Written Opinion of the International Searching Authority, PCT/US2011/039356, date of mailing Nov. 4, 2011, 9 pages.

* cited by examiner

*Primary Examiner* — Sam K Ahn
*Assistant Examiner* — Santiago Garcia
(74) *Attorney, Agent, or Firm* — Daly, Crowley, Mofford & Durkee, LLP

(57) ABSTRACT

In one aspect, a method to recover digital data includes receiving a distorted digital data stream and processing the distorted digital data stream to remove distortions. The processing includes detecting state changes, removing noise and identifying valid pulses. The processing also includes forming an undistorted data stream based on the processing.

18 Claims, 4 Drawing Sheets

RECOVERING DISTORTED DIGITAL DATA

GOVERNMENT SPONSORED RESEARCH

This invention was made with Government support under Contract Number N00019-07-C-0013 awarded by the Department of the Navy. The United States Government has certain rights in the invention.

BACKGROUND

A digital data signal can be distorted if transmitted over a long channel. For example, a transmitter sends a digital data signal at one end of a transmission line about a mile long. At an opposite end of the transmission line, the digital data signal received is typically distorted or corrupted.

SUMMARY

In one aspect, a method to recover distorted digital data includes receiving a distorted digital data stream and processing the distorted digital data stream to remove distortions using an expected pulse width. The processing includes detecting state changes, removing noise and identifying valid pulses. The processing also includes forming an undistorted data stream based on the processing.

In another aspect, an article includes a non-transitory machine-readable medium that stores executable instructions to recover distorted digital data. The instructions cause a machine to receive a distorted digital data stream, process the distorted digital data stream to remove distortions based on an expected pulse width and form an undistorted data stream based on the processing. The instructions causing the machine to process includes instructions causing the machine to detect state changes, remove noise, identify valid pulses, adjust the pulse width of the expected pulse width and determine an approximate center of the expected pulse width.

In a further aspect, an apparatus to recover distorted digital data includes circuitry to receive a distorted digital data stream, process the distorted digital data stream to remove distortions based on an expected pulse width and form an undistorted data stream based on the processing. The circuitry to process includes circuitry to detect state changes, remove noise, identify valid pulses, adjust the pulse width of the expected pulse width and determine an approximate center of the expected pulse width.

DETAILED DESCRIPTION

Described herein is an approach to recover distorted or corrupted data. Even though the techniques described herein use data encrypted using the High Density Bipolar Order 3 (HDB3) encoding protocol, the data may be encrypted using any protocol.

Figure 1:
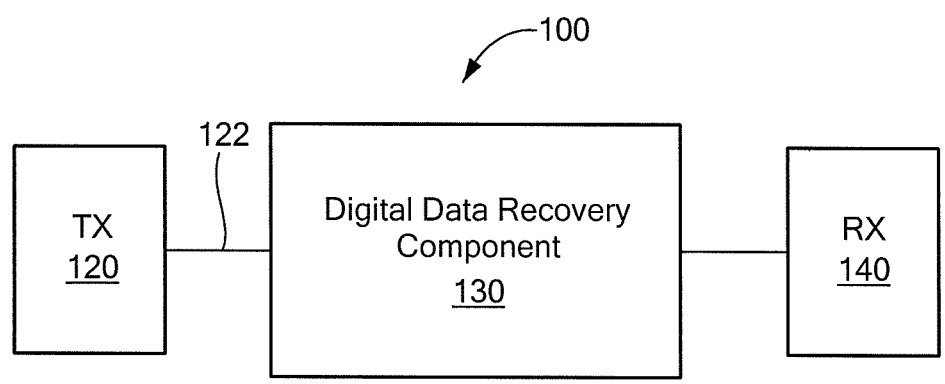
FIG. 1 is a block diagram of a digital data system.

Referring to FIG. 1, a communications architecture 100 includes a transmitter 120 configured to transmit digital data over a communications line 122, a digital data recovery (DDR) component 130 and a receiver 140. In one example, the communications line 122 is about a half mile long or more. The digital data received by the DDR component 130 is typically distorted (degraded) because of the length of the communications line 122. As will be described herein, the DDR component 130 recovers the digital data and provides the recovered digital data to the receiver 140 for normal processing.

Figure 2:
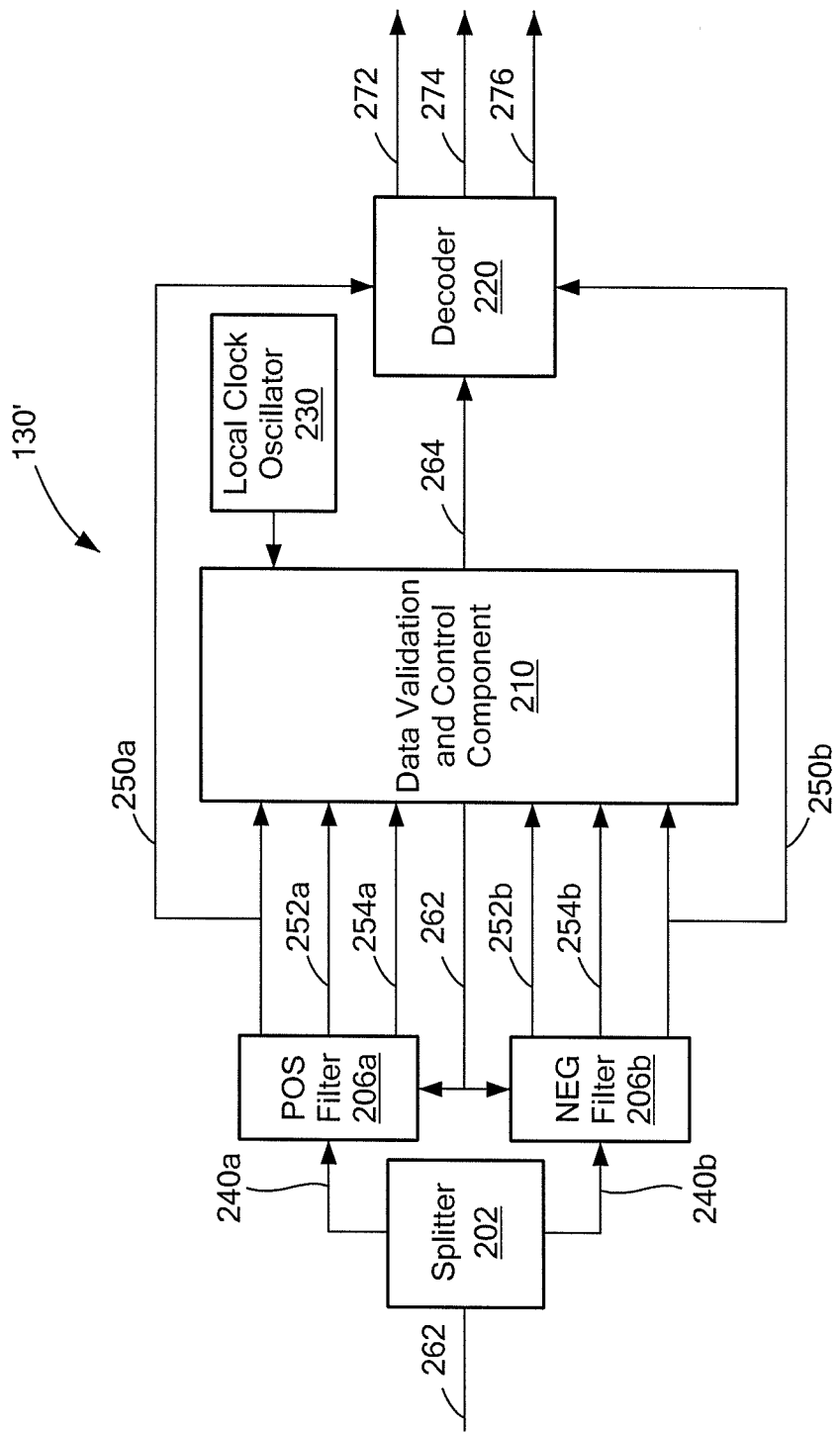
FIG. 2 is a block diagram an example of a digital data recovery component.

Referring to FIG. 2, an example of a DDR component 130 is a DDR component 130'. The DDR component 130' includes a splitter 202, a positive filter 206a (e.g., a positive digital filter), a negative filter 206b (e.g., a negative digital filter), a data validation and control component 210, a decoder 220 and a local clock oscillator 230 connected to the data validation and control component 210. In one example, the local clock oscillator 230 provides a frequency that is a multiple of the expected bit rate of the input digital data stream. In one example, the multiple is 18. In other examples, the local clock oscillator 230 does not require phase coherence with the incoming data stream.

The splitter 202 is connected to the positive filter 206a by a connection 240a and to the negative filter 206b by a connection 240b. The splitter 202 splits the digital data stream 122 to a positive component 240a (e.g., having positive pulses) and provides the positive component to the positive filter 206a. The splitter 202 also converts the digital data stream 122 to a negative component 240b (e.g., having negative pulses) and provides the negative component to the negative filter 206b. The various connections described herein may be referred to herein interchangeably with the signal or data components carried by the respective connection. For example, reference character 240a may be used interchangeably to refer to the connection between the splitter 202 and the positive filter 206a and to the positive data component associated with such a connection.

The data validation and control component 210 receives from the positive filter 206a positive serial data (e.g., positive pulses) through the connection 250a. The data validation and control component 210 also receives from the positive filter 206a rising edge data (e.g., rising edge of the positive pulses) through the connection 252a and falling edge data (e.g., falling edge of positive pulses) through the connection 254a.

The data validation and control component 210 receives from the negative filter 206b negative serial data (e.g., negative pulses) through the connection 250b. The data validation and control component 210 also receives from the negative filter 206b rising edge data (e.g., rising edge of the negative pulses) through the connection 252a and falling edge data (e.g., falling edge of positive pulses) through the connection 254a.

The data validation and control component 210 is also connected to the positive filter 206a and the negative filter 206b through a connection 262. The connection 262 provides a calibration signal from the data validation and control component 210 to the positive filter 206a and the negative filter 206b. The calibration signal 262 provides what a current expected pulse width should be so that the filters 206a, 206b can process accordingly.

The decoder 220 is connected to the data validation and control component 210 by a connection 264. The connection 264 provides a data valid signal. The data valid signal 264 indicates whether the data is valid or not and may be used as an enabling signal to control the decoder 220. The decoder 220 is also connected to the positive filter 206a by the connection 250a to receive the positive data component from the positive filter 206a and the negative filter 206b to receive the negative component from the negative filter 206b.

The decoder 220 provides at least three signals: a serial data out 272, a pattern valid signal 274 and an error count signal 276. The serial data out 272 provides the recovered and decoded data. The pattern valid signal 274 indicates whether or not the serial data out 272 is valid. The error count signal 276 indicates if there are any errors in the decoding. For example, the combined positive and negative components contained an error that violated the protocol (e.g., HDB3 protocol). In one particular example, for the HDB3 protocol, an error would be counted if both positive and negative components each received four logical 0's, two consecutive 1's are received on either the positive or negative components or two logical 1's are received on one of the positive and negative components without the other one of positive and negative components receiving a logical 1.

Figure 3:
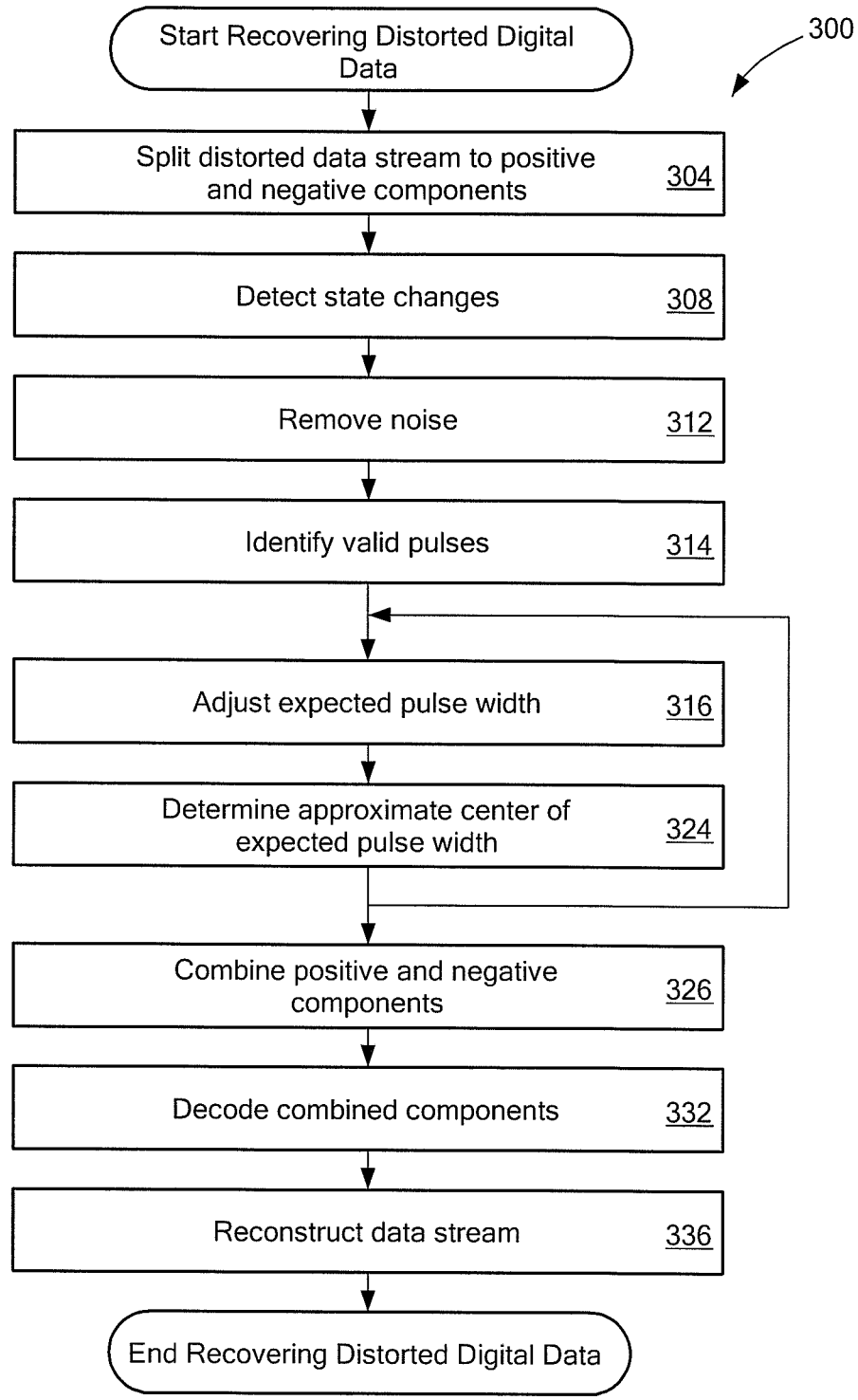
FIG. 3 is a flowchart of an example of a process to recover distorted digital data.

Referring to FIG. 3, an example of a process to recover a distorted digital data stream is a process 300. Process 300 splits the distorted data stream into positive and negative data components (304). For example, the splitter 202 splits the input data signal 122 to positive 240a and negative 240b components.

Process 300 detects the state changes (308). For example, the changes in state may be from a logical 1 to a logical 0, from a logical 0 to logical 1, from a logical −1 to a logical 0 and so forth.

Process 300 removes the noise (310). For example, positive pulses within a certain width are removed by the positive filter 206a and negative pulses within a certain width are removed by the negative filter 206b. In one particular example, pulse widths 22% of the expected pulse width are removed.

Process 300 identifies pulses that are valid (314). In one example, the data validation and control component 210 identifies the valid pulses. The data validation and control component 210 provides the data valid signal 264 to the decoder 220. In one example, the data valid signal is an enable signal indicating that valid pulses are being sent to the decoder 220. In one example, the valid pulses are those pulses that are within a qualified window. In one particular example, valid pulse widths are 22% to 73% of the expected pulse width.

Process 300 adjusts the expected pulse widths (316). For example, the validation and control component 210 determines from the pulse widths being received and from the rise and fall of the pulse widths received if the expected pulse width needs to be adjusted.

In one particular example, once a minimum pulse width has been detected (ensuring a valid data bit), then the pulse forwarded is between a minimum and maximum pulse width. If it is too small it is expanded to meet the minimum pulse width. If it is too wide, it is truncated to meet the maximum pulse width. This allows the varying pulse widths to be closer to the expected pulse width. It also uses the control timing returned in order to ensure data is not collected beyond a certain point in the expected bit width.

In one particular example, when a pulse is valid, but the pulse width is too narrow, the pulse width will be extended (widened) in order to meet a minimum pulse width used by processing block 324 for detecting the center of a pulse. A pulse width that is too narrow would cause too much skew in that particular direction if it were received too far to one side of a frame. As used herein, a "frame" is the end of the time period between the expected beginning and end of a pulse.

In another particular example, when a pulse is valid, but the pulse width is too wide, a pulse that is received but is too wide is narrowed to meet a maximum pulse width used by processing block 324. This type of pulse could be caused by too much strength in the signal preventing it from completing within the given pulse frame and causing some overlap between frames.

By limiting the width of the pulse, the overlap in frames is avoided. In one example, processing block 324 provided information to identify the expected end of the frame.

Process 300 determines an approximate center of an expected pulse width (324). For example, input pulses from processing block 316 are used to determine the location of an approximate center of each pulse. By using a clock that is a multiple times faster than the expected input clock, the expected center of the pulse can be tracked (determined). If a pulse is received that is off from the expected center, the tracking is adjusted by a percentage of the difference so as to not create unstable adjustments but rather slow and stable adjustments. Processing block 324 provides control information back to process 316 to indicate the expected end of the pulse.

In one particular example, if it is determined that the pulse width center increase from 1 ms to 2 ms, the data validation and control component 210 will indicate that a new expected pulse width center will be a percentage of that increase, for example, 50% so that the new expected pulse width center is 1.5 ms instead of the full 2 ms. By adjusting to a percentage of the change in pulse width center, erratic perturbations in the pulse width center do not create unstable adjustments; but rather, slow and stable adjustments. The data validation and control component 210 returns the calibration signal 262 to the filters 206a, 206b indicating the new expected pulse width center.

Process 300 combines the positive and negative components (326), decodes the combined components (332) and reconstructs the data stream (336). For example, the decoder 220 combines the positive and negative components and decodes the combined positive and negative components to reconstruct the data stream.

Figure 4:
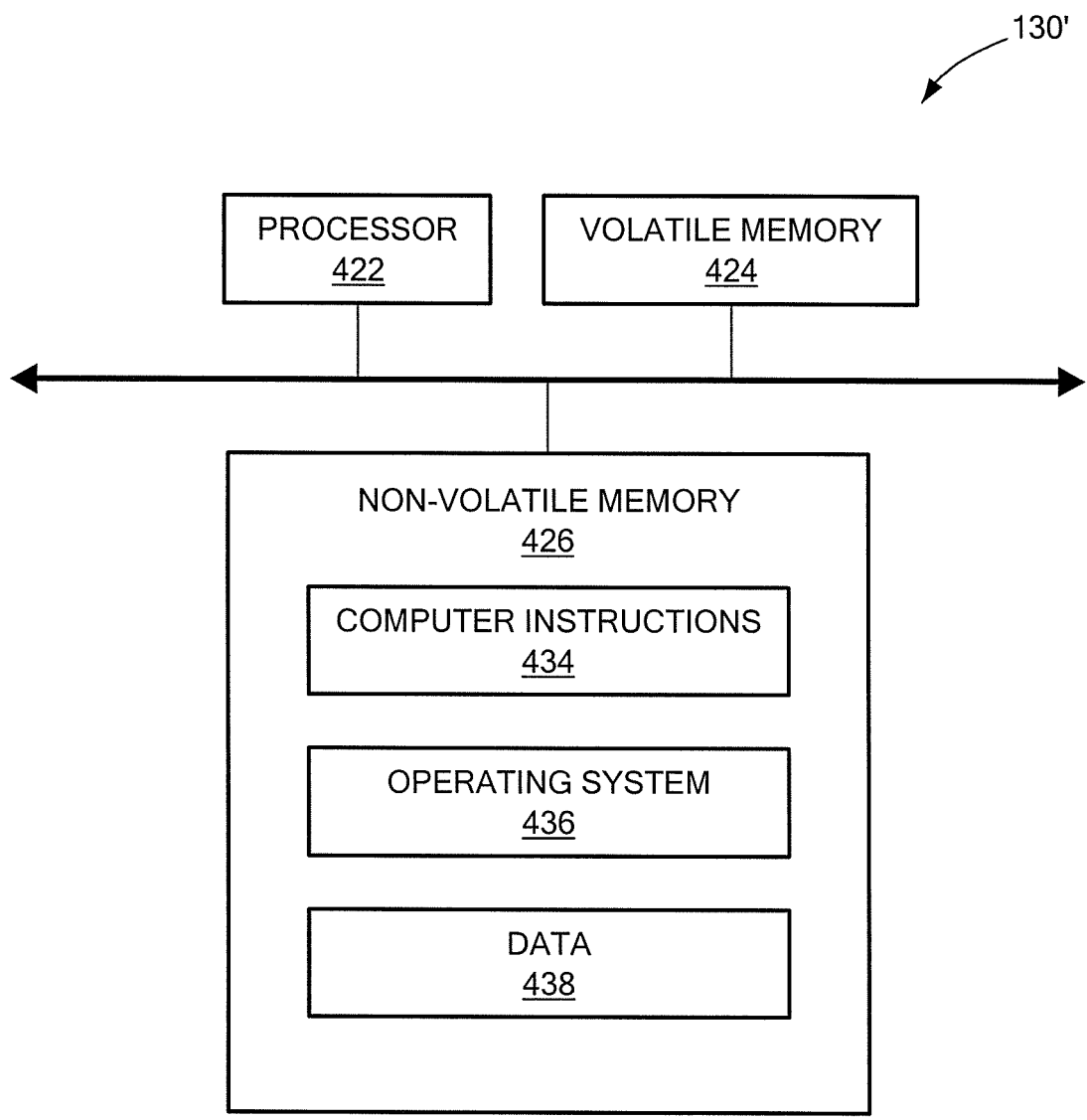
FIG. 4 is a computer on which the process of FIG. 3 may be implemented.

Referring to FIG. 4, another example of the DDR component 130 is a computer 130". The computer 130" includes a processor 422, a volatile memory 424 and a non-volatile memory 428 (e.g., hard disk). The non-volatile memory 424 stores computer instructions 434, an operating system 436 and data 438. In one example, the data 438 includes parameters that include percentages such as a percentage X % used to remove pulses with widths below X % of the expected pulse width, percentages defining a range such as Y % to Z % used to identify valid pulses that are between Y % to Z % of the expected pulse width and a percentage Q % used to change expected pulse width centers by Q % of the newly determined pulse width center. In one example, the computer instructions 434 are executed by the processor 422 out of volatile memory 424 to perform all or part of the processes described herein (e.g., the process 300).

The processes described herein (e.g., the process 300) are not limited to use with the hardware and software of FIG. 4; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a machine-readable storage device), for execution by, or to control the operation of, data processing apparatus (e.g., a programmable processor, a computer, or multiple computers)). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer to perform the processes described herein. The processes described herein may also be implemented as a machine-readable storage medium, configured with a computer program, where upon execution, instructions in the computer program cause the computer to operate in accordance with the processes.

The processes described herein are not limited to the specific embodiments described. For example, the DDR 130' receives a digital data signal that is ternary (i.e., receiving a logical zero, logical one and a logical negative one). The DDR 130' may be modified to include one rather than both of the positive filter 206*a* or the negative filter 206*b* to accommodate binary data (e.g., logical zero and logical one or logical zero and logical negative one). In a particular example, using binary data having only logical ones and zeroes, the DDR 130' would not need a negative filter 206*b*.

In another example, the process 300 is not limited to the specific processing order of FIG. 3. Rather, any of the processing blocks of FIG. 3 may be re-ordered, combined or removed, performed in parallel or in serial, as necessary, to achieve the results set forth above.

In other examples, the parameters used herein (e.g., the percentages such as those used in data 438) may be adapted to change over time in a "learning" pattern so that they are based on the latest measured data rather than being strictly hard coded.

The processing blocks in FIG. 3 associated with implementing the system may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Elements of different embodiments described herein may be combined to form other embodiments not specifically set forth above. Other embodiments not specifically described herein are also within the scope of the following claims.

What is claimed is:
1. A method to recover distorted digital data, comprising:
receiving a distorted digital data stream;
processing the distorted digital data stream to remove distortions using an expected pulse width, the processing comprising:
detecting state changes;
removing noise comprising removing pulses with widths below a percentage range of the expected pulse width;
identifying valid pulses; and
forming an undistorted data stream based on the processing; and adapting the percentage range of the expected pulse width to change over time in response to measured data.

2. The method of claim 1 wherein processing the distorted digital data stream to remove distortions based on the expected pulse width further comprises:
adjusting the expected pulse width, and determining an approximate center of the expected pulse width.

3. The method of claim 1, wherein removing pulses with widths below the percentage range of the expected pulse width comprises removing pulses with widths below 22% of the expected pulse width.

4. A method to recover distorted digital data, comprising:
receiving a distorted digital data stream;
processing the distorted digital data stream to remove distortions using an expected pulse width, the processing comprising:
detecting state changes;
removing noise;
identifying valid pulses; and
forming an undistorted data stream based on the processing,
wherein identifying valid pulses comprises identifying pulses within a qualified window,
wherein identifying valid pulses within a qualified window comprises identifying valid pulses that are a percentage range of the expected pulse width,
further comprising adapting the percentage range of the expected pulse width to change over time in response data to measured data that changes based on measured data.

5. The method of claim 4 wherein identifying valid pulses comprises identifying valid pulses that are 22% to 73% of the expected pulse width.

6. The method of claim 1 wherein processing the distorted digital data stream comprises processing separately a positive component and a negative component from the distorted digital data stream, and
further comprising:
combining the positive and negative data components to form an intermediate stream; and
decoding the intermediate stream to form the digital data stream.

7. The method of claim 6, further comprising splitting the distorted digital stream into the positive data component and the negative data component.

8. An article comprising:
a non-transitory machine-readable medium that stores executable instructions to recover
distorted digital data, the instructions causing a machine to:
receive a distorted digital data stream;
process the distorted digital data stream to remove distortions based on an expected pulse width;
form an undistorted data stream based on the processing,
wherein the instructions causing the machine to process comprise instructions causing the machine to:
detect state changes;
remove noise comprising instructions causing the machine to remove pulses with widths below a percentage range of the expected pulse width; identify valid pulses;
adjust the pulse width of the expected pulse width; determine an approximate center of the expected pulse width; and
adapt the percentage range of the expected pulse width to change over time in response to measured data.

9. The article of claim 8, wherein the instructions causing the machine to remove pulses with widths below the percentage range of the expected pulse width comprises instructions causing the machine to remove pulses with widths below 22% of the expected pulse width.

10. An article comprising:
a non-transitory machine-readable medium that stores executable instructions to recover distorted digital data, the instructions causing a machine to:
receive a distorted digital data stream;
process the distorted digital data stream to remove distortions based on an expected pulse width;
form an undistorted data stream based on the processing,
wherein the instructions causing the machine to process comprise instructions causing the machine to:
detect state changes;
remove noise;
identify valid pulses;
adjust the pulse width of the expected pulse width; and
determine an approximate center of the expected pulse width,
wherein the instructions causing the machine to identify valid pulses comprises instructions causing the machine to identify pulses within a qualified window,
wherein the instructions causing the machine to identify valid pulses within a qualified window comprises instructions causing the machine to identify valid pulses that are a percentage range of the expected pulse,
further comprising instructions causing a machine to adapt the percentage range of the expected pulse width to change overtime in response to measured data.

11. The article of claim 10 wherein the instructions causing the machine to identify valid pulses within the qualified window comprises instructions causing the machine to identify valid pulses that are 22% to 73% of the expected pulse width.

12. The article of claim 8 wherein the instructions causing the machine to process the distorted digital data stream comprises instructions causing the machine to:
process separately a positive component and a negative component from the distorted digital data stream, and
combine the positive and negative data components to form an intermediate stream; and
decode the intermediate stream to form the digital data stream.

13. An apparatus to recover distorted digital data, comprising: circuitry to:
receive a distorted digital data stream;
process the distorted digital data stream to remove distortions based on an expected pulse width;
form an undistorted data stream based on the processing,
wherein the circuitry to process comprises circuitry to:
detect state changes; remove noise; identify valid pulses; adjust the pulse width of the expected pulse width; and
determine an approximate center of the expected pulse width; and
adapt a percentage range of the expected pulse width over time in response to measured data,
wherein the circuitry to remove noise comprises circuitry to remove pulses with widths below the percentage of the expected pulse width.

14. The apparatus of claim 13 wherein the circuitry comprises at least one of a processor, a memory, programmable logic and logic gates.

15. The apparatus of claim 13 wherein the circuitry to remove noise comprises circuitry to remove pulses with widths below 22% of the expected pulse width.

16. The apparatus of claim 13 wherein the circuitry to identify valid pulses comprises circuitry to identify pulses that are 22% to 73% of the expected pulse width.

17. The apparatus of claim 13 wherein the circuitry to process the distorted digital data stream comprises circuitry to:
process separately a positive component and a negative component from the distorted digital data stream, and
combine the positive and negative data components to form an intermediate stream; and
decode the intermediate stream to form the digital data stream.

18. An apparatus to recover distorted digital data, comprising: circuitry to:
receive a distorted digital data stream;
process the distorted digital data stream to remove distortions based on an expected pulse width;
form an undistorted data stream based on the processing,
wherein the circuitry to process comprises circuitry to:
detect state changes; remove noise; identify valid pulses; adjust the pulse width of the expected pulse width; and
determine an approximate center of the expected pulse width,
wherein the circuitry to identify valid pulses comprises circuitry to identify pulses that are a percentage range of the expected pulse width,
further comprising circuitry to adapt the percentage range of the expected pulse width to change over time in response data to measured data.

* * * * *